United States Patent [19]
Ogishima

[11] Patent Number: 6,154,399
[45] Date of Patent: Nov. 28, 2000

[54] SEMICONDUCTOR STORAGE DEVICE HAVING REDUNDANCY CIRCUIT

[75] Inventor: Masamichi Ogishima, Tokyo, Japan

[73] Assignee: NEC Corporation, Tokyo, Japan

[21] Appl. No.: 09/397,533

[22] Filed: Sep. 16, 1999

[30]    Foreign Application Priority Data

Sep. 22, 1998    [JP]    Japan ................................. 10-267904

[51] Int. Cl.[7] .................................................. G11C 7/00
[52] U.S. Cl. .................. 365/200; 365/225.7; 365/230.06
[58] Field of Search .................... 365/200, 203, 365/225.7, 230.06, 189.07

[56]    References Cited

U.S. PATENT DOCUMENTS

| | | | |
|---|---|---|---|
| 5,373,471 | 12/1994 | Saeki et al. | 365/200 |
| 5,581,508 | 12/1996 | Sasaki et al. | 365/200 |
| 5,841,708 | 11/1998 | Nagata | 365/200 |
| 5,862,086 | 1/1999 | Makimura et al. | 365/200 |
| 5,970,003 | 10/1999 | Miyatake et al. | 365/200 |

*Primary Examiner*—Richard Elms
*Assistant Examiner*—Hien Nguyen
*Attorney, Agent, or Firm*—Darryl G. Walker

[57]    ABSTRACT

According to one embodiment, a semiconductor storage device (100) can provide an enhanced rate of defective sub-word line replacement by independently controlling the activation and deactivation of redundancy sub-word lines (Sw(1,0 to Sw(5,2))). Redundancy sub-word lines (Sw(1,0 to Sw(5,2))) can be connected to different redundancy sub-word drivers (114a to 114e). Sub-word selecting circuits (126-1 to 126-4) can generate 2-bit redundancy sub-word selecting signals S11 to S14 from sub-word selecting signals XN and XT and fuse output signals H11–H14 received from a fuse circuit 124. Redundancy sub-word selecting signals S11 to S14 can independently activate and deactivate redundancy sub-word lines (Sw(1,0 to Sw(5,2))) coupled to redundancy sub-word drivers (114a to 114e).

22 Claims, 9 Drawing Sheets

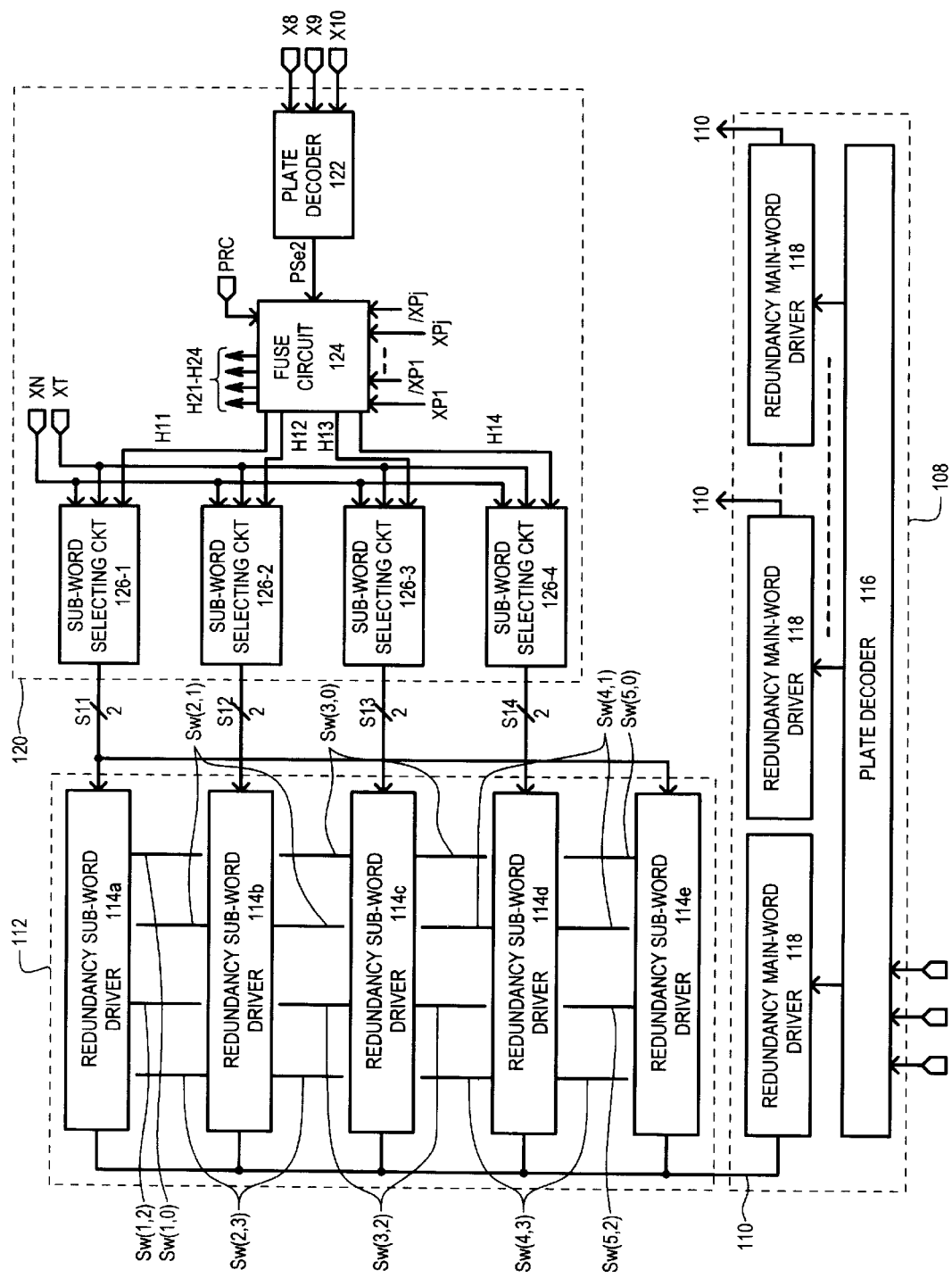
FIG. 1

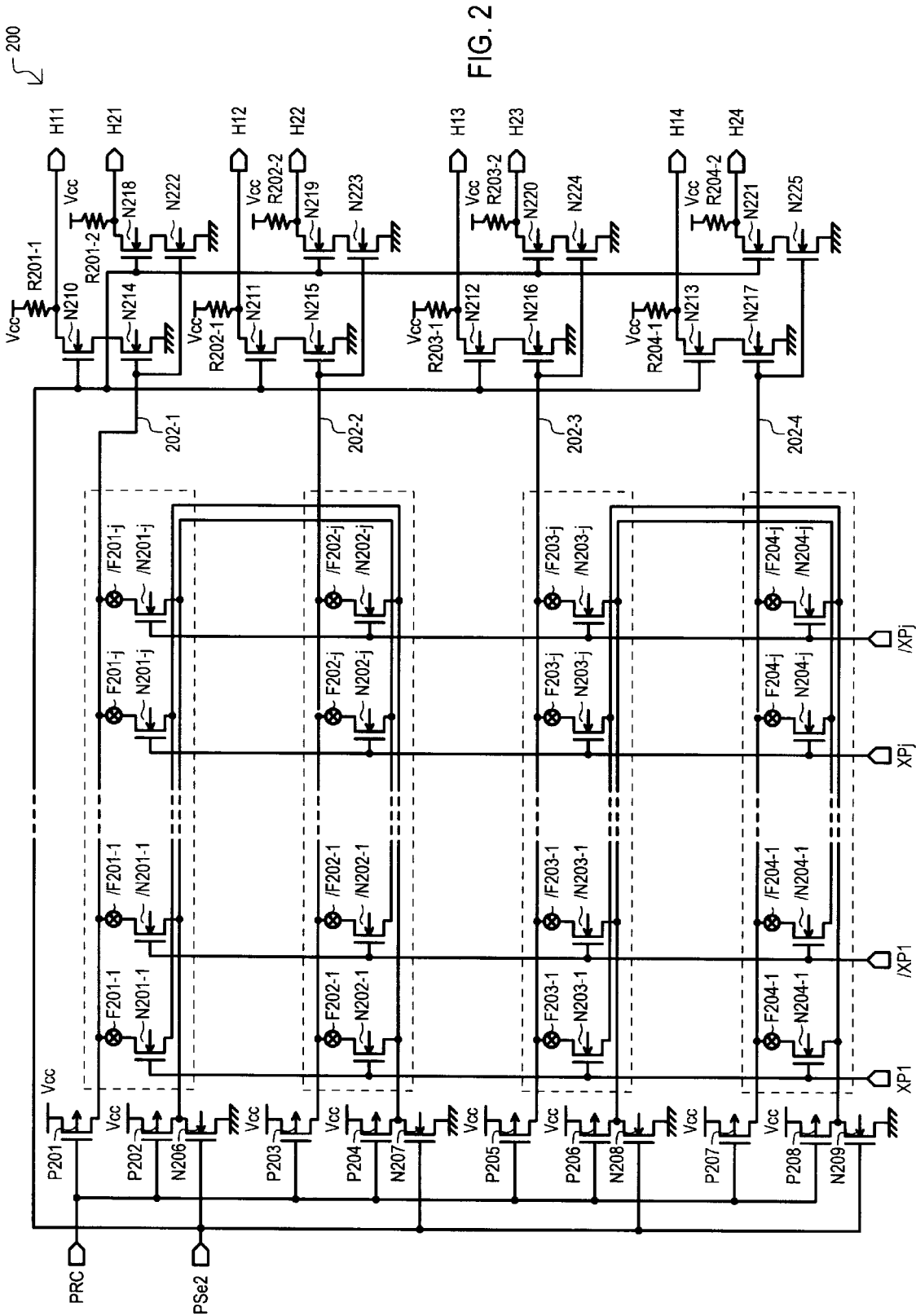
FIG. 2

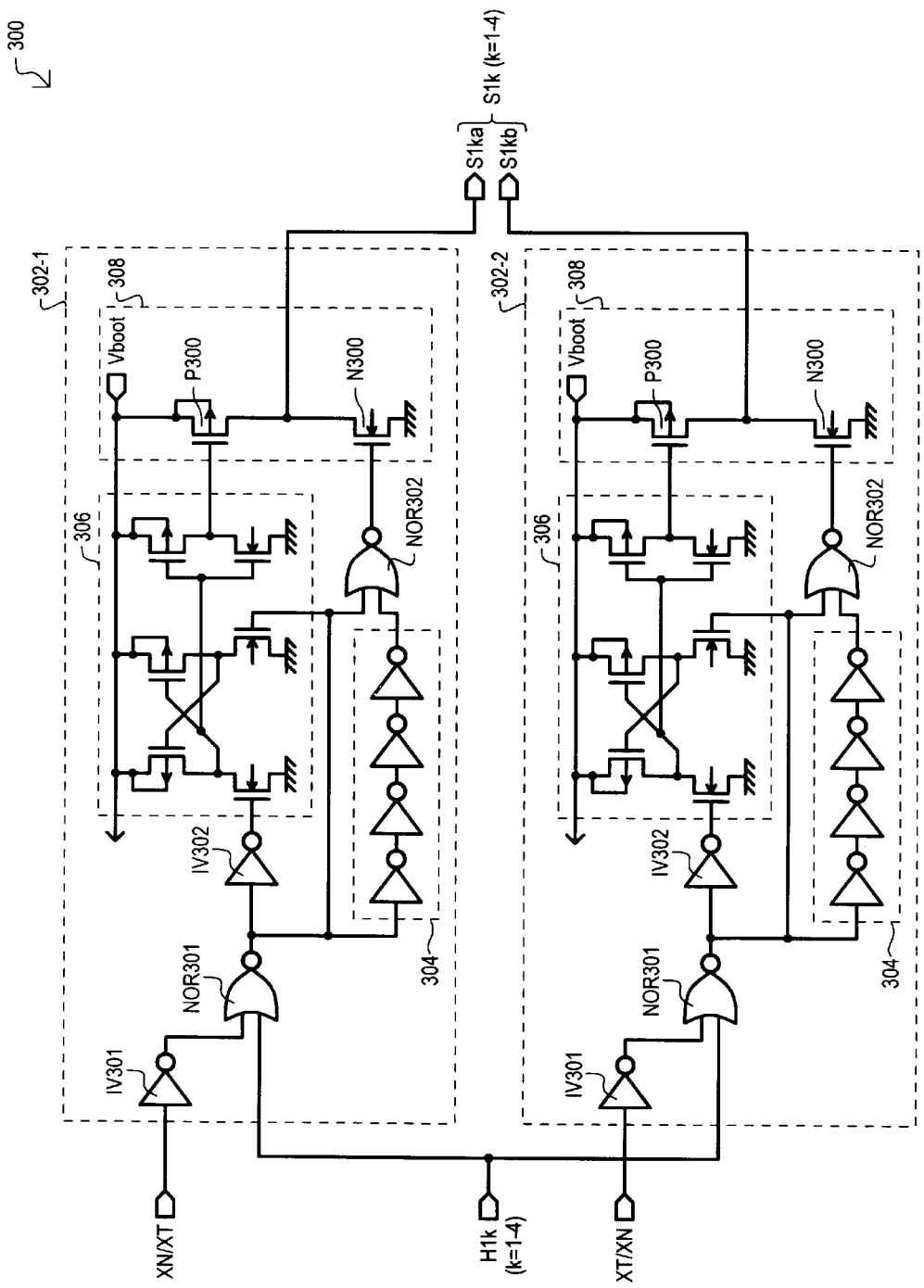
FIG. 3

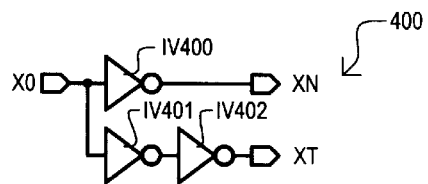
FIG. 4
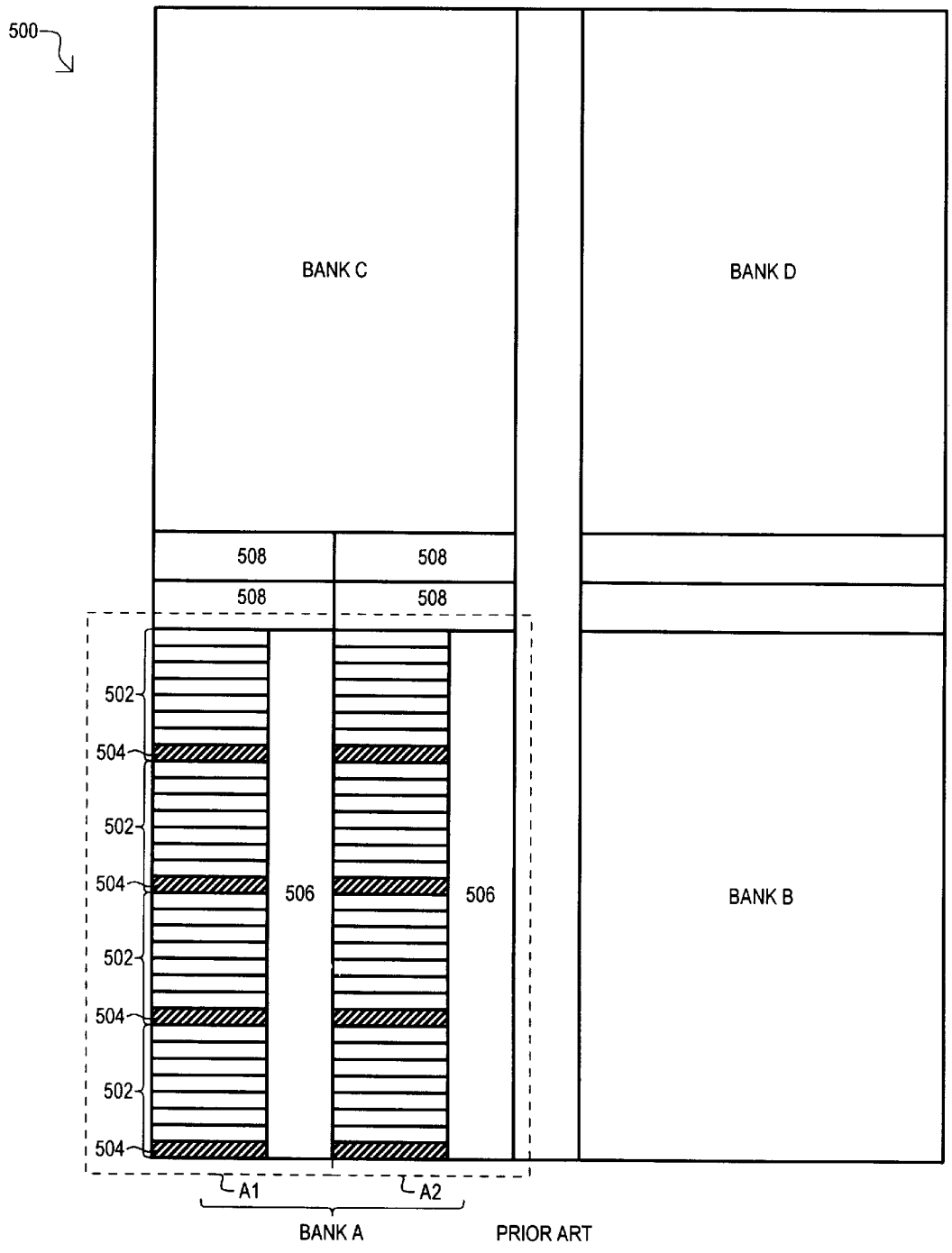
PRIOR ART
FIG. 5

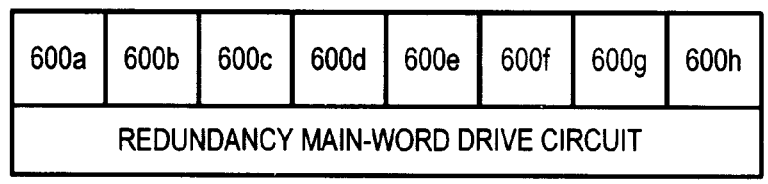
PRIOR ART
FIG. 6
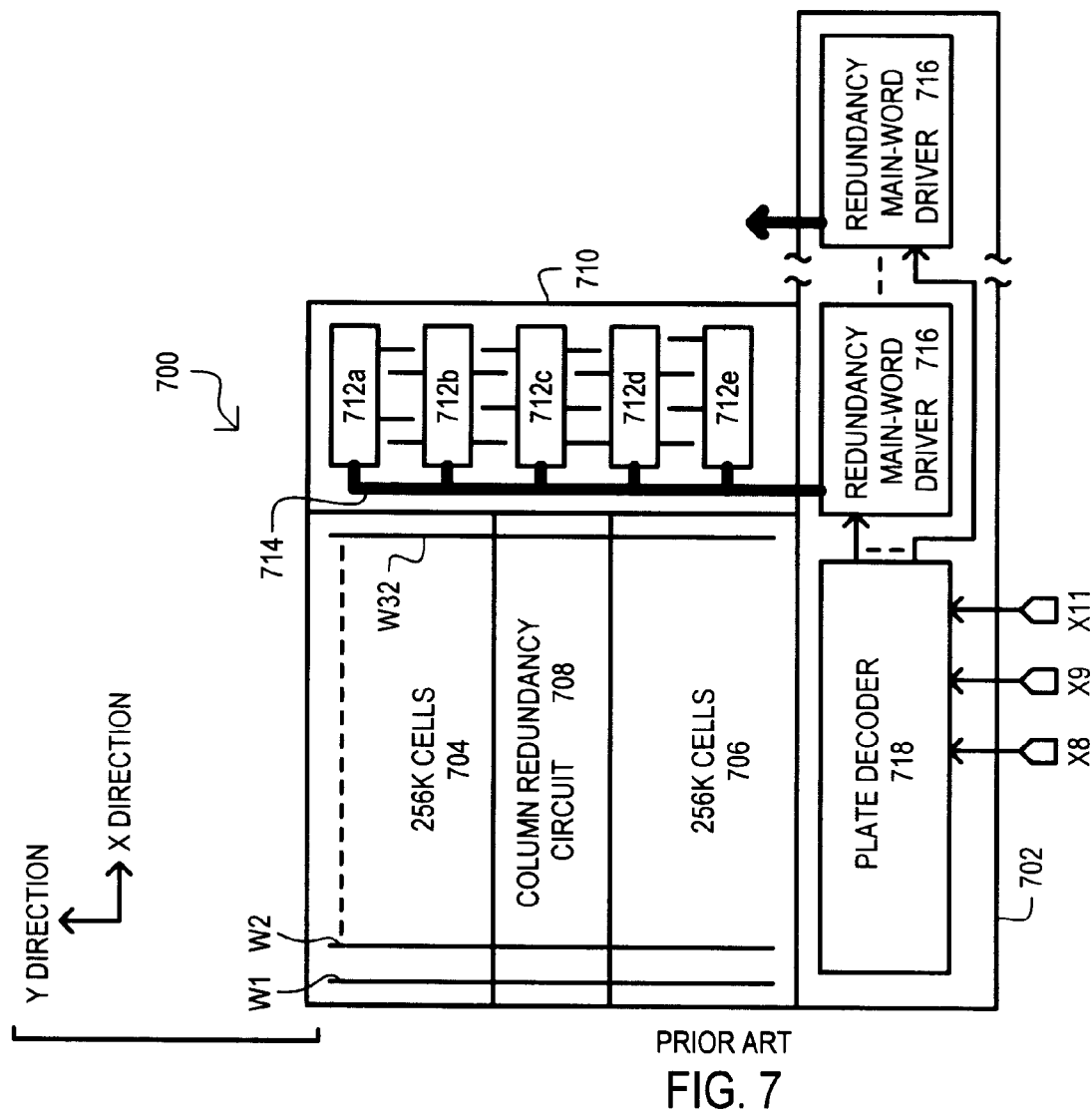
PRIOR ART
FIG. 7

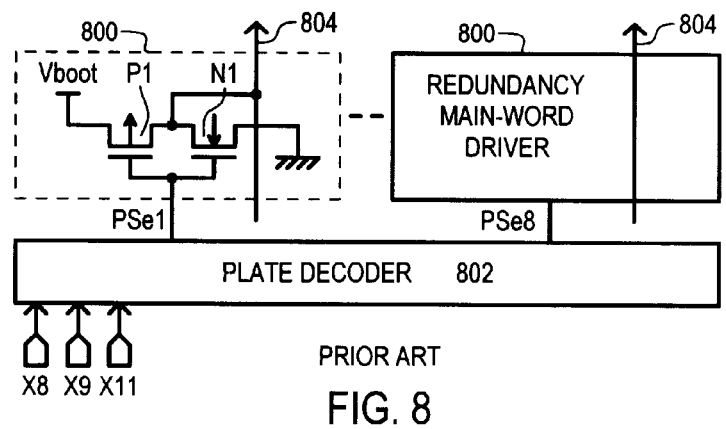
PRIOR ART
FIG. 8
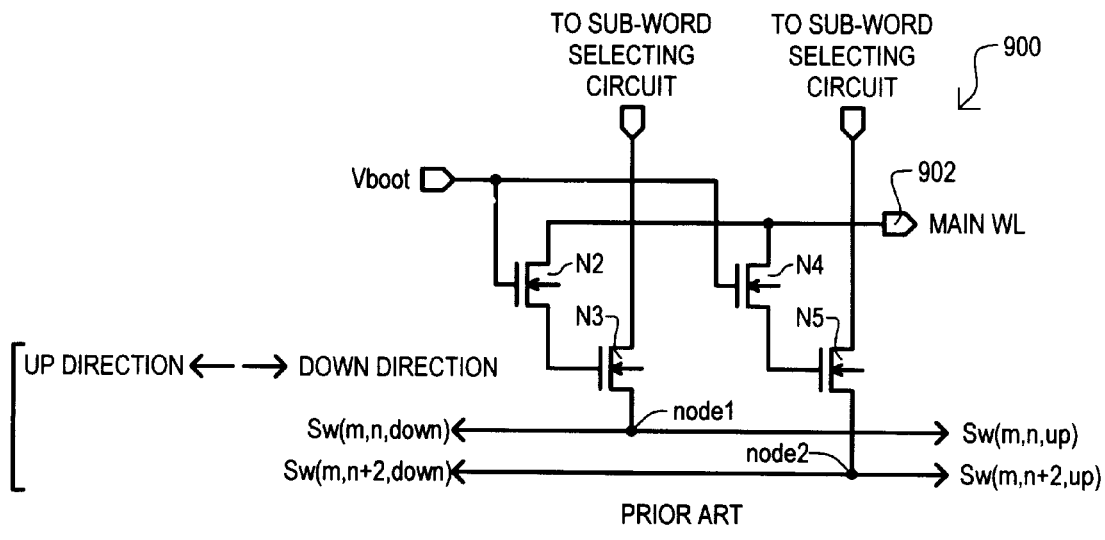
PRIOR ART
FIG. 9

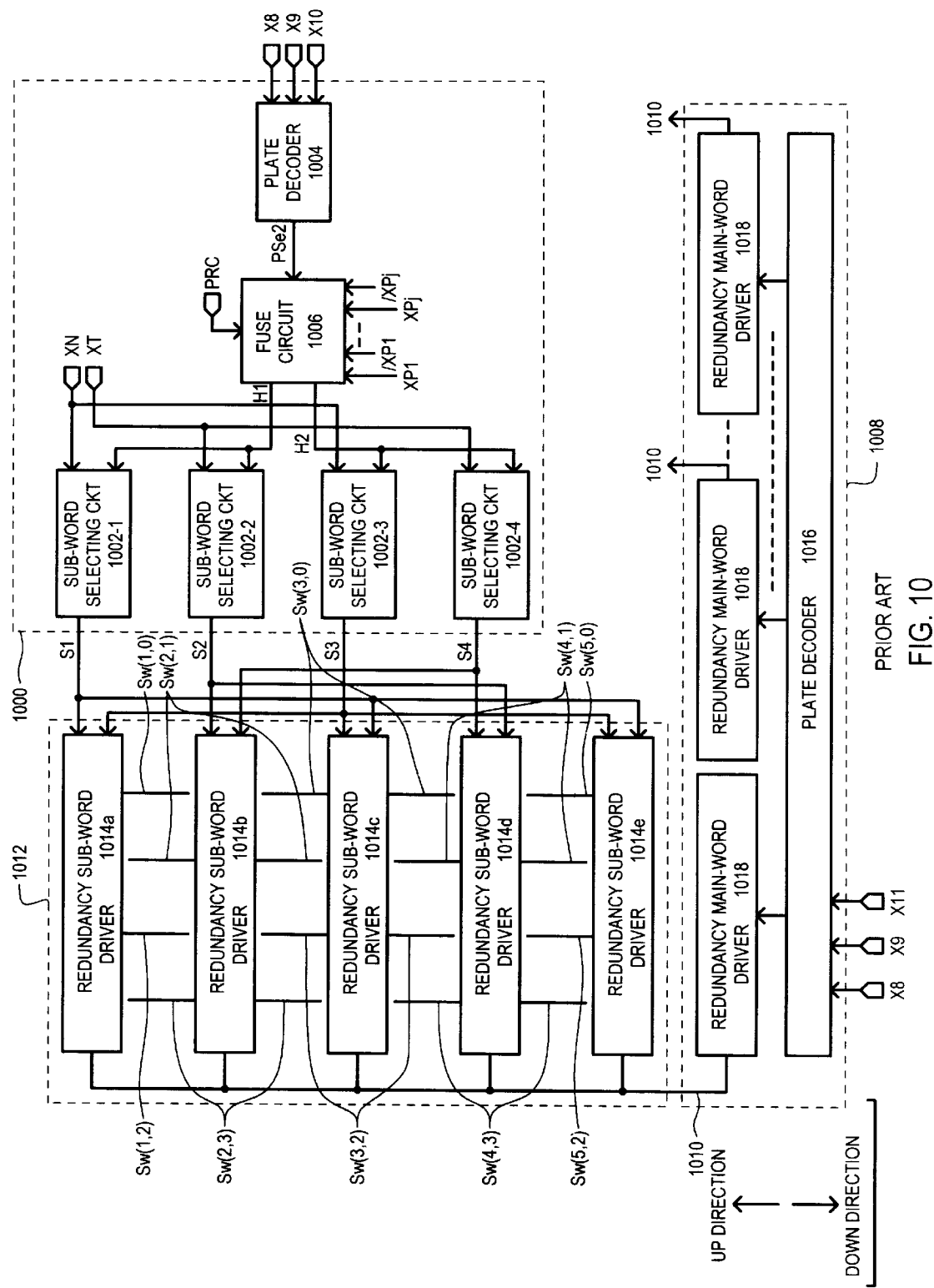
PRIOR ART
FIG. 10

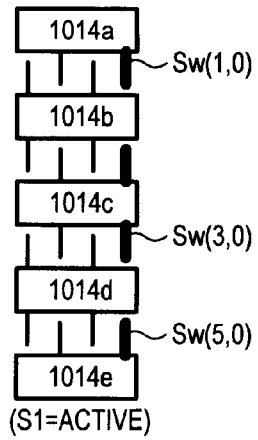
(S1=ACTIVE)
PRIOR ART
FIG. 11a
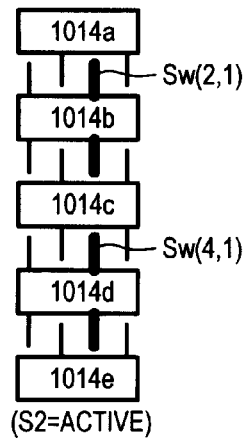
(S2=ACTIVE)
PRIOR ART
FIG. 11b
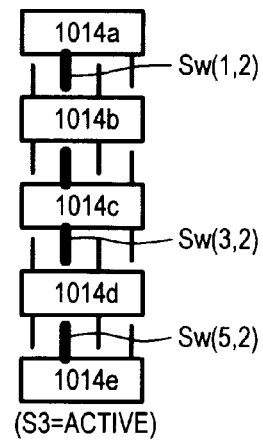
(S3=ACTIVE)
PRIOR ART
FIG. 11c
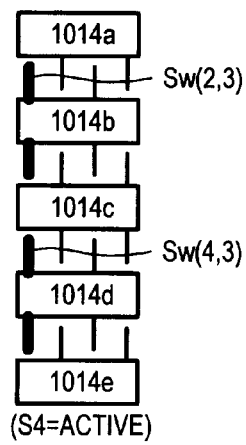
(S4=ACTIVE)
PRIOR ART
FIG. 11d
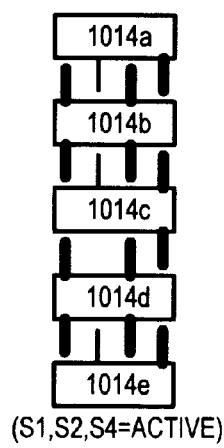
(S1,S2,S4=ACTIVE)
PRIOR ART
FIG. 11e

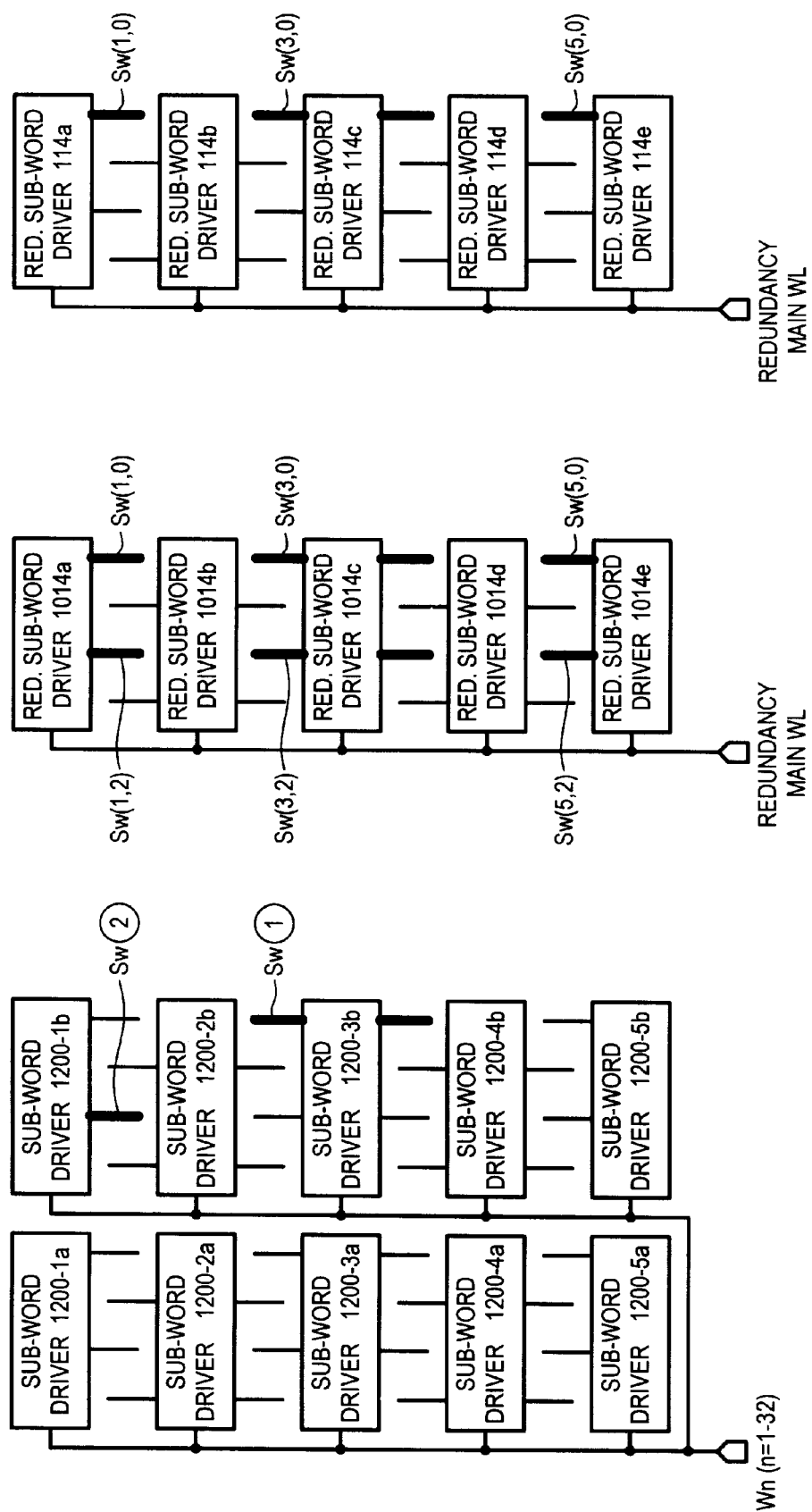
FIG. 12c
PRIOR ART
FIG. 12b
PRIOR ART
FIG. 12a

SEMICONDUCTOR STORAGE DEVICE HAVING REDUNDANCY CIRCUIT

TECHNICAL FIELD

The present invention relates generally to a semiconductor storage device, and more particularly to a semiconductor storage device having a redundancy circuit.

BACKGROUND OF THE INVENTION

In recent years, the capacity of memory devices, such as dynamic random access memories (DRAMs), has substantially increased. As just one example, DRAMs having capacities of 16 Megabits (Mb) and 64 Mb are widely used. With drastic increases in memory capacity, such as those described above, there can be an increase in the number of defects in such semiconductor storage devices.

One way to address defects in a semiconductor storage device is to include a word line redundancy circuit. A word line redundancy circuit can include a previously prepared redundant word line that can replace a defective word line.

To better understand the embodiments of the present invention, a configuration of a 64 Mb memory cell array of a 64 Mb DRAM will be described with reference to FIG. 5. The memory cell array 500 can include four banks (shown as Banks A to D) having the same structure, and including a memory capacity of 16 Mb.

Bank A is shown to include sub-banks A1 and A2 having the same layout configuration, and a memory capacity of 8 Mb. Sub-bank A1 is shown to include input/output (I/O) units 502, each having a capacity of 2 Mb and including 8 plates. One plate within each I/O unit 502 is shown as item 504. Bank A is shown to further include redundancy main-word drive circuit 506 and redundancy selection control circuit 508.

Next, methods for selecting banks (such as Banks A–D), sub-banks (such as A1 and A2) and plates (such as 504) will now be described with reference to FIGS. 6 and 7.

Banks A–D can be selected by addresses X12 and X13, as shown in Table 1. Sub-banks A1–D1 or A2–D2 can be selected by an address X10, as shown in Table 2. It is understood that sub-banks A1 and A2 can be sub-banks within Bank A, sub-banks B1 and B2 can be sub-banks within Bank B, sub-banks C1 and C2 can be sub-banks within Bank C, and sub-banks D1 and D2 can be sub-banks within Bank D.

TABLE 1

| X12 | X13 | Bank |
|---|---|---|
| 0 | 0 | A |
| 1 | 0 | B |
| 0 | 1 | C |
| 1 | 1 | D |

TABLE 2

| X10 | A1/A2 | B1/B2 | C1/C2 | D1/D2 |
|---|---|---|---|---|
| 0 | A1 | B1 | C1 | D1 |
| 1 | A2 | B2 | C2 | D2 |

FIG. 6 includes 8 plates 600a to 600h (such as those shown 502 in FIG. 5) that may be included in an I/O unit (such as those shown as 502 in FIG. 5). The 8 plates (600a to 600h) can be selected by addresses X8, X9, and X11, as shown in Table 3.

TABLE 3

| X11 | X9 | X8 | Plate number |
|---|---|---|---|
| 0 | 0 | 0 | 600a |
| 0 | 0 | 1 | 600b |
| 0 | 1 | 0 | 600c |
| 0 | 1 | 1 | 600d |
| 1 | 0 | 0 | 600e |
| 1 | 0 | 1 | 600f |
| 1 | 1 | 0 | 600g |
| 1 | 1 | 1 | 600h |

Referring back to FIG. 5, the plates 504 identified with oblique lines illustrated how four plates may be selected at one time. For example plates 504 may correspond to a plate 600a in four I/O units. In a similar fashion, another plate (600b600h) may be selected from multiple I/O groups by addresses X8, X9 and X11.

Next, a plate 700 (such as that shown as 504 or 600a–600h), and a redundancy main-word drive circuit 702 disposed in contact with a plate 700, will be described with reference to FIG. 7.

A plate 700 can include a 256K cells 704 and 706, a column redundancy circuit 708, row redundancy circuit 710. 256K cells (704 and 706) can store 256K (256×1024) A column redundancy circuit 708 can replace a defective digit line within 256K cells and 706) with a redundant digit line. A row redundancy circuit 710 can replace a defective word line in 256K cells (704 and 706), and/or a defective memory cell connected to a word line.

As shown in FIG. 7, a plate 700 can include main word lines W1 to W32 disposed within 256K cells 704 and 706. A main word line (W1 to W32) can drive eight sub-word lines. Therefore, 256K cells (704 and 706) can be driven by 256 sub-word lines (32×8 sub-word lines).

Further, 256K cells (704 and 706) can include 1024 digit line pairs arranged in a column direction. In such a particular arrangement, memory cells within 256K cells (704 and 706) may be selected by 256 sub-word lines and 1024 digit line pairs.

A row redundancy circuit 710 can be configured to include five redundancy sub-word drivers 712a–712e. A single redundancy main word line 714 can be connected to the redundancy sub-word drivers (712a–712e). Redundancy sub-word lines can be connected, two by two, to the redundancy sub-word drivers (712a–712e). Redundancy sub-word lines can extend in a +Y and −Y direction as shown in FIG. 7, with opposing sub-word lines having the shape of a comb. Furthermore, redundancy memory cells (not shown), for replacing defective memory cells, can be connected to redundancy sub-word lines.

A redundancy main-word drive circuit 702 can include 32 (8×4) redundancy main-word drivers 716. As one example, a redundancy main-word driver 716 can be capable of driving a redundancy main-word line (such as 714) in each plate of a sub-bank. A redundancy main-word drive circuit 702 can further include a plate decoder 718. A plate decoder 718 can receive addresses X8, X9 and X11 and generate a plate selecting signal that can select a plate, including a redundancy main-word driver 716 within the selected plate.

Referring now to FIGS. 7–10, a more detailed description of a redundancy main-word drive circuit 702 and a row redundancy circuit 710 will be given. In addition, a description will be given for a redundancy selection control circuit (shown as 1000 in FIG. 10). A redundancy selection control circuit can select redundancy sub-word lines (shown as Sw(1,0) to Sw(5,2)) that can be connected to redundancy sub-word drivers (such as 712a–712e).

In FIG. 10, sub-word lines are designated as Sw(m,n), where m can represent a particular redundancy sub-word driver (such as 712a–712e in FIGS. 7 and 10) (a vertical position) and m=1–5. The value n can represent a horizontal position and have a value of 0–3. In one particular case, a right end position, with respect to the orientation of FIG. 10, can be indicated by n=0 and a left end position, with respect to the orientation of FIG. 10, can be indicated by n=3.

Initially, a redundancy main-word drive circuit (such as 702) will be described. As noted above, a redundancy main-word drive circuit can decode addresses (such as X8, X9 and X11) with a plate decoder (such as 718) and generate a plate selecting signal. A plate selecting signal can activate a redundancy main word line (such as 714). In one particular arrangement, decode addresses X8, X9 and X11 can activate one of eight main word lines.

Referring now to FIG. 8, one example of the internal circuit of a redundancy main-word driver (such as 716) is set forth in a circuit diagram. A redundancy main-word driver is designated by the general reference character 800. Also included in FIG. 8 is a plate decoder 802. A main-word driver 800 may include a p-channel transistor P1 and an n-channel transistor N1. P-channel transistor P1 can have a source connected to a boot power source Vboot and a gate connected to a plate selecting signal PSe1. A boot power supply source Vboot can provide a potential that may be higher than a high power supply potential. A plate selecting signal PSe1 may be generated from a plate decoder 802. N-channel transistor N1 can have a source that is connected to a low power source (grounded, for example), a drain that is connected to the drain of p-channel transistor P1, and a gate that can receive the plate selecting signal PSe1. The drain-drain connection of p-channel transistor P1 and n-channel transistor N1 can be connected to a redundancy main word line 804.

Referring again to FIG. 8, when plate selecting signal PSe1 is high, n-channel transistor N1 can turn on and a redundancy main-word line 804 can go low, and be deactivated. When plate selecting signal PSe1 is low, p-channel transistor P1 can turn on and a redundancy main-word line 804 can go high (to Vboot in this particular example), and be activated.

Referring now to FIG. 9, a redundancy sub-word driver (such as 712a to 712e in FIG. 7) will be described. A redundancy sub-word driver is designated by the general reference character 900 in FIG. 9.

A redundancy sub-word driver 900 can include n-channel transistors N2 and N4 and n-channel transistors N3 and N5. N-channel transistors N2 and N4 can have gates connected to a boot power source Vboot and drains connected to a main-word line 902. The sources of transistors N2 and N4 can be connected to the gates of transistors N3 and N5, respectively. N-channel transistors N3 and N5 can have drains connected to the output terminals of sub-word selecting circuits (shown as 1002-1 to 1002-4 in FIG. 10). The source of n-channel transistor N3 can be connected to redundancy sub-word lines Sw(m, n, up) and Sw(m, n, down), and the source of n-channel transistors N5 can be connected to redundancy sub-word lines Sw(m, n+2, up) and Sw(m, n+2, down). Up and down directions are illustrated by arrows in FIG. 9.

In the arrangement illustrated by FIGS. 9 and 10, redundancy sub-word lines Sw(m,n,up) and Sw(m,n,down) can represent redundancy sub-word lines disposed in an up and down direction with respect to nodes (shown as node1 and node2 in FIG. 9) of sub-word lines Sw(m,n).

It is noted that in the particular arrangement of FIG. 10, for redundancy sub-word lines Sw(1,0) and Sw(1,2), there are no redundancy sub-word lines in the "up" direction. Also, for redundancy sub-word lines Sw(5,0) and Sw(5,2), there are no redundancy sub-word lines in the "down" direction.

Referring once again to FIG. 9, the operation of a redundancy sub-word driver 900 will be described.

When redundancy main-word line 902 is low, transistors N2–N5 can be turned off, independent of output signals from sub-word selecting circuits. Therefore, redundancy sub-word lines Sw(m,n,up) to Sw (m,n+2,down) can be inactive.

If a redundancy main-word line 902 rises to a boot power source voltage, n-channel transistors N2 to N5 can turn on. An output voltage from sub-word selecting circuits can be connected from the drains of transistors N3 and N5 to nodes node1 and node2, respectively.

As just one example, the output terminals of sub-word selecting circuits connected to n-channel transistor N3 can be high (at the boot power source voltage) while the output terminals of sub-word selecting circuits connected to n-channel transistor N5 can be low (at ground). When redundancy main-word line 902 is activated, redundancy sub-word lines Sw(m,n,down) and Sw(m,n,up) can be activated (high), while redundancy sub-word lines Sw(m,n+2, down) and Sw(m,n+2,up) can be deactivated (at a ground potential).

Thus, in the arrangement illustrated, active and inactive states of the redundancy sub-word lines Sw(m,n) can be controlled by the activation and deactivation of a redundancy main-word line 902 and the voltage of the output nodes of sub-word selecting circuits (such as 1002-1 to 1002-4 in FIG. 10).

One skilled in the art would recognize that n-channel transistors N3 and N5 can provide controllable impedance paths to redundancy sub-word lines Sw(m,n,up/down) and Sw(m, n+2, up/down). Such controllable impedance paths can be controlled by a main-word line potential. Further, activating potentials can be provided to redundancy sub-word lines Sw(m,n,up/down) and Sw(m, n+2, up/down) by way of the controllable impedance paths.

As shown in FIG. 10, a semiconductor storage device with a redundancy circuit can include a redundancy selection control circuit 1000 that includes sub-word line selecting circuits 1002-1 to 1002-4, a plate decoder 1004 and a fuse circuit 1006. Also included is a redundancy main-word drive circuit 1008 that can activate a selected redundancy main-word line 1010. A redundancy main-word line 1010 can activate selected sub-word lines Sw(1,0) to Sw(5,2) in a row redundancy circuit 1012. Sub-word lines Sw(1,0) to Sw(5,2)) can be activated and deactivated by redundancy sub-word line drivers 1014a to 1014e. Redundancy sub-word line drivers 1014a to 1014e may correspond to redundancy sub-word line drivers 712a to 712e shown in FIG. 7.

Also shown by FIG. 10, a redundancy main-word drive circuit 1008 can include a plate decoder 1016 and redundancy main-word drivers 1018.

Within redundancy selection control circuit 1000, a plate decoder 1004 can generate a plate selecting signal PSe2 from addresses X8, X9 and X10. A fuse circuit 1006 can include a number of fuses that can be opened according to a defective address (an address corresponding to a main word line that is to be replaced). According to a plate selecting signal PSe2, a precharge signal PRC, and address selecting signals (XP1 to XPj), a fuse circuit 1006 can generate fuse output signals H1 and H2. Sub-word selecting circuits (1002-1 to 1002-4) can receive fuse output signals H1 and H2 and sub-word selecting signals XN and XT and generate redundancy sub-word selecting signals S1 to S4. Redundancy sub-word selecting signals S1 to S4 can select sub-word lines Sw(1,0) to Sw(5,2).

Next, the operation of redundancy selection control circuit 1000 will be described.

Initially, a redundancy main-word driver 1008 can receive addresses X8, X9 and X11, and activate a redundancy main-word line 1010.

Fuse circuit 1006 can include a number of fuses that can be opened according to the address selecting signals of defective sub-word lines in 256K cells (such as 704 and 706 in FIG. 7). Such a setting of fuse values can be performed when a memory test is made on a semiconductor device while it is in wafer form, as just one example.

In a semiconductor memory device having a redundancy circuit, such as that set forth in FIG. 10, if a pre-charge signal PRC is activated, fuse circuit 1006 can be activated. If an activated plate selecting signal PSe2 and address selecting signals (XP1 to XPj) correspond to a defective address, fuse circuit 1006 can generate fuse output signals H1 and H2 for sub-word selecting circuits 1002-1 to 1002-4 that can replace a defective sub-word line.

Next, sub-word selecting circuits 1002-1 to 1002-4 can place redundancy sub-word selecting signals S1–S4 into an active or inactive state according to fuse output signals H1 and H2 and sub-word selecting signals XN and XT. In this arrangement, if both signals received by a sub-word selecting circuit (1002-1 to 1002-4) are active, a corresponding redundancy sub-word line selecting signal S1 to S4 can be activated. If one of the signals received by a sub-word selecting circuit (1002-1 to 1002-4) is inactive, a corresponding redundancy sub-word line selecting signal S1 to S4 can be deactivated.

Referring now to FIGS. 10 and 11a to 11e, a method of selecting redundancy sub- word lines Sw(1,0) to Sw(5,2) according to redundancy sub-word selecting signals S1–S4 will be described. In the following description it is assumed that redundancy main-word line 1010 connected to the illustrated row redundancy circuit 1012 has been activated.

FIG. 11a illustrates an example of the selection of sub-word lines Sw(1,0) to Sw(5,0) in the case where redundancy sub-word selecting signal S1 is activated, while the remaining redundancy sub-word selecting signal S2–S4 are inactive. Redundancy sub-word selecting signal S1 has been received by redundancy sub-word drivers 1014a, 1014c and 1014e, within a row redundancy circuit 1012, resulting in redundancy sub-word lines to the right (in FIGS. 10 and 11a–11e) being activated (redundancy sub-word lines Sw(1, 0), Sw(3,0) and Sw(5,0)). Activated redundancy sub-word lines are shown as thick lines in FIG. 11a.

FIG. 11b shows a case where redundancy sub-word selecting signal S2 is activated, while the remaining redundancy sub-word selecting signal S1, S3 and S4 are inactive. FIG. 11c shows a case where redundancy sub-word selecting signal S3 is activated, while the remaining redundancy sub-word selecting signal S1, S2 and S4 are inactive. FIG. 11d shows a case where redundancy sub-word selecting signal S4 is activated, while the remaining redundancy sub-sub-word selecting signal S1 to S3 are inactive. Active redundancy sub-word lines are shown by thick lines.

FIG. 11e shows a case where redundancy sub-word line signals S1, S2 and S4 are activated while redundancy sub-word line S3 is inactive. As in the cases above, active redundancy sub-word lines are shown by thick lines. It is noted that the disclosed approach allows the selection of redundancy sub-word lines according to the cases shown in FIGS. 11a–11d, and FIG. 11e shows redundancy sub-word lines that are activated at different times.

Referring now to FIG. 12a, a diagram is set forth illustrating internal circuits of 256K cells (such as those shown as 704 and 706). Such internal circuits can include sub-word drivers 1200-1a to 1200-5a and 1200-1b to 1200-5b. Sub-word drivers 1200-2a to 1200-4a and 1200-2b to 1200-4d can include two sub-word lines wired in the up and down directions (in FIG. 12a). Sub-word drivers 1200-1a and 1200-1b can include two sub-word lines wired in the down direction, and sub-word drivers 1200-5a and 1200-5b can include two sub-word lines wired in the up direction.

FIGS. 12a and 12b can illustrate how a defective sub-word line can be replaced by a conventional redundancy sub-word line approach. Referring again to FIG. 12a, assume that right sub-word line Sw① of sub-word driver 1200-3b and left sub-word line Sw② of sub-word driver 1200-1b are defective. FIG. 12b shows how redundancy sub-word lines in the previously described row redundancy circuit can be activated to replace defective sub-word lines Sw① and Sw②.

In particular, in accordance with defective sub-word line Sw①, redundancy sub-word lines Sw(1,0), Sw(3,0) and Sw(5,0) can be activated. In accordance with defective sub-word line Sw②, redundancy sub-word lines Sw(1,2), Sw(3,2) and Sw(5,2) can be activated.

In the above-described semiconductor memory with a redundancy circuit, a defective sub-word line in 256K cells (such as 704 and 706) can be replaced with redundancy sub-word lines Sw(1,0) to Sw(5,2) in a row redundancy circuit (such as 1012). As shown in FIGS. 12a and 12b, a defective sub-word line is replaced by activating four redundancy sub-word lines. A drawback to such an approach is that all the redundancy sub-word lines in a vertical direction (in the view of FIGS. 12a and 12b) are used to replace one defective sub-word line.

That is, as shown in FIG. 12a, in order to replace defective sub-word line Sw(D, redundancy sub-word lines Sw(1,0), Sw(3,0) and Sw(5,0) are all used. Although defective sub-word line Sw① ought to be replaced with a single redundancy sub-word line Sw(3,0), a redundancy selection control circuit (such as 1000 of FIG. 10) cannot control redundancy sub-word lines independently. Therefore, redundancy sub-word lines for recovering defective sub-word lines are not used effectively in such a conventional approach.

SUMMARY OF THE INVENTION

Due to the above described drawbacks of conventional redundancy approaches, it is an object of the present invention to provide a semiconductor storage device with a redundancy circuit that can independently control the activation and deactivation of redundancy sub-word lines connected to different redundancy sub-word drivers. Such a redundancy circuit can improve the rate at which possibly defective devices can be recovered.

Another object of the present invention is to provide a semiconductor storage device with a redundancy circuit that can replace a defective sub-word line with a redundancy sub-word line while leaving unnecessary redundancy sub-word lines inactive. Such a redundancy circuit can reduce power dissipation.

A semiconductor storage device with a redundancy circuit according to the present invention may comprise:

a number of memory cells;

main-word lines for selecting the memory cells;

sub-word lines associated with the main word lines that provide a lower level of memory cell selection than the main-word lines;

a row redundancy circuit for replacing said main word lines, or said memory cells connected to said sub-word lines where a fault has occurred, the row redundancy circuit including redundancy main-word lines, redundancy sub-word lines, and redundancy memory cells;

redundancy main-word drivers for driving said redundancy main-word lines; and a redundancy selection control circuit for controlling said row redundancy circuit, wherein said row redundancy circuit includes a plurality of redundancy sub-word drivers for driving a plurality of said redundancy sub-word lines; and said redundancy selection control circuit independently performs control of the activation and deactivation of each said redundancy sub-word line.

BRIEF DESCRIPTION OF THE DRAWINGS

FIG. 1 is a block diagram of a semiconductor storage device with a redundancy circuit according to one embodiment of the present invention.

FIG. 2 is a circuit diagram of a fuse circuit according to one embodiment.

FIG. 3 is a circuit diagram of a sub-word selecting circuit according to one embodiment.

FIG. 4 is a circuit diagram of a sub-word selecting signal generating circuit.

FIG. 5 is a schematic plan view of a memory cell array of a conventional 64 Megabit dynamic random access memory.

FIG. 6 is a schematic plan view of an input/output (I/O) unit.

FIG. 7 is a circuit diagram of a plate.

FIG. 8 is a circuit diagram of redundancy main-word drivers.

FIG. 9 is a circuit diagram of a redundancy sub-word driver.

FIG. 10 is a circuit diagram that includes a conventional redundancy selection control circuit.

FIGS. 11a through 11e are explanatory diagrams showing a conventional method of controlling redundancy sub-word drivers.

FIG. 12a is an explanatory diagram showing defective sub-word lines. FIG. 12b is an explanatory diagram showing a conventional approach to replacing defective sub-word lines in FIG. 12a. FIG. 12c is an explanatory diagram showing an approach to replacing defective sub-word lines in FIG. 12a according to one embodiment.

DETAILED DESCRIPTION OF THE EMBODIMENTS

A description of one embodiment of the present invention will now be made with reference to a number of drawings. It is noted that the disclosed embodiment may include portions that can be common to the previously described conventional approach of FIG. 10. Like portions will be referred to with like reference characters, but with the first digit being a "1" instead of "10."

A semiconductor storage device with a redundancy circuit can be basically the same as the previously described conventional semiconductor storage device of FIGS. 5–10, but with a different redundancy selection control circuit 120.

Referring now to FIG. 1, circuit block diagrams are set forth illustrating a semiconductor memory device with a redundancy circuit according to one embodiment of the present invention. As shown in FIG. 1, the embodiment can include a redundancy main-word drive circuit 108, redundancy main-word lines 110, row redundancy circuit 112, redundancy sub-word drivers 114a to 114e, a plate decoder 116, and redundancy main-word drivers 118. Also included is the redundancy selection control circuit 120 that can select redundancy sub-word lines Sw(1,0) to Sw(5,2) that can be connected to redundancy sub-word drivers (114a to 114e).

One skilled the art would recognize that while redundancy main-word lines are shown perpendicular to redundancy sub-word lines in FIG. 1, such an arrangement should not be construed as limiting to the present invention. As just one of the many possible variations, a redundancy main-word line can be parallel to redundancy sub-word lines.

One skilled in the art would recognize that redundancy sub-word lines can be conceptualized as providing a lower level of redundancy than redundancy main-word lines. While a redundancy main-word line can provide access to a particular number of redundancy memory cells, redundancy sub-word lines can provide access to a smaller number of redundancy memory cells. As just one example, a redundancy sub-word line can provide access to a subset of those redundancy memory cells accessed by a redundancy main-word line.

One skilled the art would further recognize that while redundancy sub-word lines can be construed as providing a "lower" level of redundancy than a redundancy main-word line, such redundancy sub-word lines are not necessarily in a physically lower position than redundancy main-word lines. For example, redundancy main-word lines may be formed from a same conductive layer or a different conductive layer than redundancy sub-word lines.

In a particular configuration, a redundancy main-word drive circuit 108 and row redundancy circuit 112 can have the same general configuration as those in the conventional approach set forth in FIG. 10. Therefore, a description of these portions will be omitted, and a redundancy selection control circuit 120 according one embodiment will be described in detail.

A redundancy selection control circuit 120 can include a plate decoder 122, a fuse circuit 124, and sub-word selecting circuits 126-1 to 126-4. A plate decoder 122 can receive addresses X8, X9 and X10 and generate a plate selecting signal PSe2. A fuse circuit 124 can include a number of fuses that have been opened according to addresses of defective sub-word lines that are to be replaced. A fuse circuit 124 can receive a precharge signal PRC, the plate selecting signal PSe2, and address selecting signals, and generate fuse output signals H11 to H14 and H21 to H24. Sub-word selecting circuits 126-1 to 126-4 can receive sub-word selecting signals XN and XT and particular fuse output signals (H11 to H14), and select redundancy sub-word lines Sw(1,0) to Sw(5,2).

Next, the operation of redundancy selection control circuit 120 will be described.

Initially, it is assumed that addresses X8, X9 and X11 correspond to the redundancy main-word line 110 connected to the illustrated row redundancy circuit 112, and the main-word line 110 is activated.

Fuses within fuse circuit 124 can be opened according to the address of a defective sub-word line (present in 256K cells such as 704 and 706). Such an operation can take place during a memory test performed on the semiconductor memory device, while the memory device is in wafer form, as just one example.

In operation, a semiconductor memory device with a redundancy circuit according to one embodiment can activate a precharge signal PRC. This can activate fuse circuit 124. If plate selecting signal PSe2 is activated by addresses X8, X9 and X10, and address selecting signals (XP1,/XP1 to XPj,/XPj) correspond to a defective sub-word line, fuse output signals H11–H14 can be provided that select a redundancy sub-word line, and fuse output signals H21 to H24 can be provided that deactivate a defective sub-word line that is to be replaced. A defective sub-word line can be in a structure like 256K cells shown as 704 and 706 in FIG. 7.

As noted above, fuse output signals H21 and H24 can deactivate a defective sub-word line. Thus, current does not flow in memory cells coupled to the defective sub-word line, and dissipated current can be reduced.

Next, sub-word selecting circuits 126-1 to 126-4 can activate two-bit redundancy sub- word selecting signals S11–S14 according to fuse output signals H11–H14 and sub-word selecting signals XN and XT.

One way in which the operation of sub-word selecting circuits 126-1 to 126-4 can differ from conventional sub-word selecting circuits (such as those shown as 1002-1 to 1002-4 in FIG. 10) is that redundancy sub-word drivers 14a to 114e can be controlled independently by redundancy sub-word selecting signals S11 to S14.

That is, redundancy sub-word drivers 114a and 114e can be controlled by redundancy sub-word selecting signals S11, while redundancy sub-word drivers 114b, 114c, 114d can be controlled by redundancy sub-word selecting signals S12, S13 and S14, respectively. In this way, redundancy sub-word lines Sw(1,0) to Sw(5,2) can be independently controlled according to redundancy sub-word selecting signals S11 to S14.

One example of such a control arrangement is set forth in Table 4. Table 4 illustrates how redundancy sub-word selecting signals S12 can place redundancy sub-word lines Sw(2, 1) and Sw(2,3) into active and inactive states. In the particular case of Table 4, a low state is inactive and a high state is active. The two bit signal S12 is represented by a first bit value S12a and a second bit value S12b.

TABLE 4

| S12 | | | |
|---|---|---|---|
| S12a | S12b | Sw(2,1) | Sw(2,3) |
| 0 | 0 | Low | Low |
| 0 | 1 | Low | High |
| 1 | 0 | High | Low |
| 1 | 1 | High | High |

Having described circuits for replacing defective sub-word lines according to one embodiment, a replacement operation will now be described with reference to FIGS. 12a and 12c. In FIG. 12a, the right sub-word line Sw(①) of sub-word driver 1200-3b, and the left sub-word line Sw(②) of sub-word driver 1200-1b are assumed to be defective. As noted previously, such sub-word lines can be present in 256K cells structures, such as that shown as 704 and 706 in FIG. 7.

Referring now to FIG. 12c, in one embodiment, defective sub-word line Sw(①) can be replaced by activating redundancy sub-word line (3,0) and defective sub-word line Sw(②) can be replaced by activating redundancy sub-word lines Sw(1,0) and Sw(5,0).

Therefore, the present invention can address the disadvantages of a conventional semiconductor storage device, illustrated by FIG. 12b, in which all of the redundancy sub-word lines in the vertical direction are used when defective sub-word lines are replaced by redundancy sub-word lines.

Further, by independently controlling the activation and deactivation of redundancy sub-word lines connected to different sub-word drivers, defective sub-word lines can be replaced at an increased rate. As just one specific example, in a conventional semiconductor storage device with a redundancy circuit, as illustrated by FIGS. 12a and 12b, only four defective sub-word lines can be replaced. However, in a semiconductor storage device with a redundancy circuit according to one embodiment, as illustrated by FIGS. 12a and 12c, eight defective sub-word lines (2 sub-word lines per row×4 rows). Thus, the rate of replacing defective sub-word line can be doubled over the described conventional approach.

Still further, while a redundancy sub-word line can be used to replace a defective sub-word line, those redundancy sub-word lines that are not necessary for such a replacement operation can be deactivated. In this way, the present invention can reduce power dissipation over conventional semiconductor storage devices with redundancy circuits.

As but one example, if reference is made to FIG. 12a, where there is a defect in sub-word line Sw(①) alone, as shown by FIG. 12b, a conventional semiconductor storage device with a redundancy circuit will activate redundancy sub-word lines Sw(1,0) and Sw(5,0) along with Sw(3,0). This can waste current, as current will be dissipated by redundancy sub-word lines Sw(1,0) and Sw(5,0). On the other hand, in embodiments of the present invention, as shown by FIG. 12c, redundancy sub-word line Sw(3,0) can be activated alone to replace defective sub-word line Sw(①). As a result, redundancy sub-word lines Sw(1,0) and Sw(5,0) can remain inactive, reducing current dissipation over the conventional approach.

Referring now to FIG. 2, a fuse circuit is shown that may be used in the embodiment of FIG. 1. The fuse circuit of FIG. 2 is designated by the general reference character 200, and is shown to include p-channel transistors P201, P203, P205 and P207, load p-channel transistors P202, P204, P206 and P208, fuses F201-1 to F201-j and /F201-1 to /F201-j, fuses F202-1 to F202-j and /F202-1 to /F202j, fuses F203-1 to F203-j and /F203-1 to /F203-j, and fuses F204-1 to F204-j and /F204-1 to /F204-j.

Also included in the particular fuse circuit 200 are switch n-channel transistors N201-1 to N201-j and /N201-1 to /N201-j, N202-1 to N202-j and /N202-1 to /N202-j, N203-1 to N203-j and /N203-1 to /N203-j, and N204-1 to N204-j and /N204-1 to /N204-j. Switch n-channel transistors can be arranged in series with fuses, and receive address selecting signals (XP1 to XPj and /XP1 to /XPj).

The arrangement of FIG. 2 also includes n-channel transistors N206 to N209. The drains of n-channel transistors N206 to N209 are connected to the sources of switch n-channel transistors (N201-1 to /N204-j). When a plate selecting signal PSe2 goes to an active state (high, in this particular example) n-channel transistors N206 to N209 can turn on, connecting their respective drains to a ground potential.

A fuse circuit 200 can further include output n-channel transistors N210 to N213 and N214 to N217 that can control fuse output signals H11 to H14. In addition, output n-channel transistors N218 to N221 and N222 to N225 can control fuse output signals H21 to H24. Fuse output signals H11 to H14 can be used to activate redundancy sub-word lines, while fuse output signals H21 to H24 can be used to deactivate defective sub-word lines. Such a defective sub-word line can be present in a 256K cell arrangement, such as that shown as 704 and 706 in FIG. 7. By deactivating a defective sub-word line according to output signals H21 to H24, current dissipation can be advantageously reduced.

One skilled in the art would recognize that n-channel output transistors (N210 to N225) can be arranged in pairs associated with each fuse output signal. As just one example, output n-channel transistors N210 and N214 can be associated with fuse output signal H11. When either n-channel output transistor is turned off, its respective fuse output signal can remain at a first logic value (a Vcc potential in the particular example—due to pull-up resistances R201-1 to R204-2). When both n-channel output transistors of a fuse output signal are turned on, the fuse output signal can be driven to a second logic value (a ground potential in the particular example of FIG. 2). Of course, the arrangement of FIG. 2 sets forth a particular "static" pull-up and "dynamic" pull-down configurations, other such configurations may be employed to drive fuse output signals H11 to H24.

It is noted that in the arrangement of FIG. 2, two output circuits can be provided for essentially the same output signal. As one example, one skilled in the art would recognize that output signal H11, generated by the operation of resistance R201-1 and n-channel transistors N210 and N214, may have the same response as output signal H21, generated by the operation of resistance R201-2 and n-channel transistors N218 and N222. Such an arrangement can be used to distribute a wiring load between the two output circuits. The wiring from fuse circuit 200 to a sub-word selecting circuit 126-1 to 126-4, and from fuse circuit 200 to a non-redundancy portion of a device (such as 256K cells 704 and 706 in FIG. 7) can be substantial.

As is apparent in FIG. 2, a fuse circuit 200 can be conceptualized as including four stages, one stage that includes fuses F201-1 to /F201-j and can generate fuse output signals H11 and H21, another stage that includes fuses F202-1 to /F202-j and can generate fuse output signals H12 and H22, another stage that includes fuses F203-1 to /F203-j and can generate fuse output signals H13 and H23, and another one stage that includes fuses F204-1 to /F204-j and can generate fuse output signals H14 and H24. Such stages can have the same general configuration, but can include fuses that are programmed differently.

Next, the operation of a fuse circuit 200 will be described.

In operation, fuses F201-1 to /F201-j of a first stage, fuses F202-1 to /F202-j of a second stage, fuses F203-1 to /F203-j of a third stage, and fuses F204-1 to /F204-j of a fourth stage can be programmed (e.g., opened or cut) according to the address of defective sub-word lines. Such a programming of fuses can occur at a memory test performed on a semiconductor storage device while it is in wafer form, as just one example. One skilled in the art would recognize that none of the fuses may be programmed if there are no corresponding defective sub-word lines, and the programming of the fuses in all four stages represents a worst case state.

Referring once again to FIG. 2, a pre-charge signal PRC and plate selecting signal PSe2 can go low and high, respectively. One skilled in the art would recognize that pre-charge signal PRC can initially go low, and then return high. Plate selecting signal PSe2 can then go high. When precharge signal PRC is low, p-channel transistors P201 to P208 can be turned on. One skilled in the art would recognize that a low precharge signal PRC can precharge nodes 202-1 to 202-4 to a predetermined potential (Vcc). In addition, a low precharge signal PRC can precharge the common sources of n-channel switch transistors (N201 -1 to /N204-j) to the predetermined potential (Vcc).

When the precharge signal PRC returns high and plate selecting signal PSe2 goes high, transistors N206 to N209 can turn on. With transistors N206 to N209 turned on, if address selecting signals (XP1-XPj and /XP1-/XPj) correspond to an address of a defective sub-word line, one of the nodes 202-1 to 202-4 can remain high, while the remaining nodes 202-1 to 202-4 can be discharged. As just one example, if node 202-1 remains high, n-channel transistors N214 and N222 can be turned on, and fuse output signals H11 and H21 can go low. In the same general fashion, if another node 202-2 to 202-4 go high, a corresponding pair of fuse output signals H12–H14 to H22–H24 will go low.

When address selecting signals (XP1-XPj and /XP1-/XPj) do not correspond to an address of a defective sub-word line all nodes 202-1 to 202-4 can go low, and output signals H11–H14 to H21–H24 can remain high.

One skilled the art would recognize that a fuse circuit such as that set forth in FIG. 2 can be conceptualized as a programmable address detect circuit, as fuses can be programmed to detect a match between an applied address value and a programmed address value.

Referring now to FIG. 3, a sub-word selecting circuit will be described. The sub- word selecting circuit of FIG. 3 can correspond to one or more of the sub-word selecting circuits shown as 126-1 to 126-4 in FIG. 1.

The sub-word selecting circuit of FIG. 3 is designated by the general reference character 300, and can include two selecting-signal generating circuits 302-1 and 302-2 having the same general configuration. One selecting-signal generating circuit 302-1 can receive a sub-word selecting signal XT/XN while another selecting-signal generating circuit 302-2 can receive another sub-word selecting signal XN/XT.

In the arrangement of FIG. 3, a selecting-signal generating circuit 302-1/2 may include an inverter IV301, a NOR gate NOR301, another inverter IV302, a delay circuit 304, a boosting circuit 306, and an output circuit 308. Inverter IV301 can receive a sub-word selecting signal (such as XN or XT). A NOR gate NOR301 can receive the output of inverter IV301 and a fuse output signal H1k. The output of NOR301 can be received by inverter IV302, boosting circuit 306, and delay circuit 304. Boosting circuit 306 may also receive the output of inverter IV302.

A boosting circuit 306 can boost the output of inverter IV302. One skilled in the art would recognize that boosting circuit 306 can boost a high output of inverter IV302 to a boot voltage Vboot. A boot voltage can be greater than a high power supply voltage.

An output circuit 308 can include a p-channel transistor P300 and an n-channel transistor N300. An output circuit 308 can provide a redundancy sub-word selecting signal S1ka or S1kb.

One skilled in the art would recognize that a p-channel transistor P300 provides a controllable impedance path between a boot voltage and a node that provides a sub-word selecting signal.

As shown in Table 5, when a fuse output signal Hk1 is 1 (high) both redundancy sub-word selecting signals S1ka and S1kb can go to 0, independently of the states of sub-word selecting signals XN and XT. A high output signal Hk1 can indicate that input address selecting signals (such as XP1 to /XPj) do not correspond to an address of a defective sub-word line. With both redundancy sub-word selecting signals S1ka and S1kb low, corresponding redundancy sub-word drivers (such as 114a to 114e in FIG. 1) are inactive.

TABLE 5

| H1k | XN | XT | S1ka | S1kb |
|---|---|---|---|---|
| 1 | * | * | 0 | 0 |
| 0 | 0 | 1 | 0 | 1 |
| 0 | 1 | 0 | 1 | 0 |

(* = don't care)

Referring again to FIG. 3, when fuse output signal H1k is zero, for example when input address selecting signals (such as XP1 to /XPj) correspond to an address of a defective redundancy sub-word line, either of the redundancy sub-word selecting signals S1ka or S1kb can go to a logic 1 (high) according to the values of the sub-word selecting signals XN and XT. In this way, a redundancy sub-word line (Sw(1,0) to Sw(5,2)) corresponding to the activated sub-word selecting signals (S1ka S1kb) can be activated.

As just one example, assume that a sub-word selecting circuit 300 provides sub-word selecting signals (S12) to a redundancy sub-word driver 114b. If sub-word selecting signals S12a and S12b are 1 and 0 (or 0 and 1), respectively, redundancy sub-word line Sw(2,1) (or Sw(2,3)) can be activated.

Further, redundancy sub-word selecting signals S11 (which can include S11a and S11b) can control redundancy sub-word drivers 114a and 114e, redundancy sub-word selecting signals S12 (which can include S12a and S12b) can control redundancy sub-word driver 114b, redundancy sub-word selecting signals S13 (which can include S13a and S13b) can control redundancy sub-word driver 114c, and redundancy sub-word selecting signals S14 (which can include S14a and S14b) can control redundancy sub-word drivers 114d. In this way, redundancy sub-word selecting signals S11 to S14 can control redundancy sub-word lines Sw(1,0) to Sw(5,2) independently.

Referring again to FIG. 3, boosting circuit 306 can be employed to convert the output signal level of inverter IV302. One skilled in the art would recognize that this can allow the logic levels of inverter IV302 to activate (and deactivate) p-channel transistors P300 which receives the boot power source voltage Vboot. Further, the output of gate NOR301 or inverter IV302 can be considered an activation control signal, as its logic level can control the activation of p-channel transistor P300, and the signal received at the gate of p-channel transistor P300 can be considered a boost control signal, as it can turn p-channel transistor P300 on or off.

In this way, redundancy sub-word selecting signals S1ka and S1kb supplied to a redundancy sub-word driver can have a logic high level at the boot power source voltage Vboot. Such a redundancy sub-word driver can include a circuit such as that set forth in FIG. 9.

In FIG. 3, a delay circuit 304 can provide a timing margin for controlling the switching of redundancy sub-word selecting signals S1ka and S1kb provided as outputs from selecting-signal generating circuit 302-1 and 302-2. For example, when fuse output signal H1k transitions from an inactive state to an active state, or conversely from an inactive state to an active state.

One skilled in the art would recognize that the arrangement of delay circuit 304 and gate NOR302 can be considered an edge delay circuit, as it can provide an output signal that delays particular edges of an input signal.

Referring now to FIG. 4, an example of a sub-word selecting signal generating circuit is set forth in a schematic diagram. The sub-word selecting signal generating circuit is designated by the general reference character 400 and can generate sub-word selecting signals XN and XT. The sub-word selecting signal generating circuit 400 can receive a least significant address A0. The address A0 can be inverted by an inverter IV400 to generate sub-word selecting signal XN. Sub-word selecting signal XT can be generate by address A0 being applied to inverters IV401 and IV402.

In the above mentioned embodiments, while various descriptions have set forth sub-word drivers having two redundancy sub-word lines, the present invention can be easily expanded to a greater number of sub-word lines per sub-word driver. As just one example, a sub-word driver can include 3 or 4 redundancy sub-word lines by increasing the number of bits in sub-word selecting signals and/or fuse output signals.

Further, the above mentioned embodiments have described arrangements in which redundancy sub-word lines are situated below main-word lines. However, the present invention could include redundancy word line arrangements having increased layers. As just one example, a memory can include redundancy main-word lines, first redundancy sub-word lines situated below main-word lines, and second redundancy sub-word lines situated below first redundancy sub-word lines. One skilled in the art would recognize that first and/or second redundancy sub-word lines could be independently activated according to the teachings of the present invention.

Still further, the present invention can be applicable to volatile memories, such as dynamic random access memories (DRAMs) and static RAMs (SRAMs), to name but two examples. The present invention can also be applicable to nonvolatile memories, such as electrically programmable read only memories (EPROMs), electrically erasable and programmable ROMs (EEPROMs), including flash EEPROMs, and ferroelectric RAMs (FRAMs or FeRAMs), to name but a few limited examples.

As has been described above, the present invention can enhance the rate of replacing defective sub-word lines by independently controlling the activation redundancy sub-word lines.

Further, the present invention can reduce power dissipation by maintaining redundancy sub-word lines that are not necessary in a replacement operation in an inactive state. Also, as noted above, the present invention can further reduce power dissipation by deactivating defective sub-word lines.

One skilled in the art would recognize that a defective sub-word line can include a sub-word line that includes defects, as well as a sub-word line that is coupled to defective memory cells.

One skilled in the art would also recognize that while a fuse circuit has been described that includes fusible links that can be opened ("cut"), alternate structures can be utilized. As but one example, nonvolatile memory structures can be used to determine if an applied address corresponds to the address of a defective redundancy sub-word line.

It is understood that while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor storage device with a redundancy circuit, comprising:
 a plurality of memory cells;
 at least one main-word line;
 sub-word lines associated with the at least one-main word line;
 a row redundancy circuit that can replace a defective sub-word line, the row redundancy circuit including redundancy main-word lines, redundancy sub- word lines, redundancy sub-word drivers that drive the redundancy sub-word lines between at least two different potentials according to sub-word selecting signals, and redundancy memory cells;
 redundancy main-word drivers that can drive redundancy main word lines between at least two different potentials; and
 a redundancy selection control circuit that controls the row redundancy circuit and independently activates redundancy sub-word lines, the redundancy selection control circuit including a plurality of sub-word selecting circuits that each provide the sub-word selecting signals at a boost voltage, the boost voltage being greater than a power supply voltage for the semiconductor storage device.

2. The semiconductor storage device with a redundancy circuit of claim 1, wherein:
 each redundancy sub-word driver drives N redundancy sub-word lines, where N is an integer greater than 2; and
 each sub-word selecting circuit provides an N-bit redundancy sub-word selecting signal that controls the activation and deactivation of the sub-word lines coupled to a sub-word driver.

3. The semiconductor storage device with a redundancy circuit of claim 2, wherein:
 the redundancy selection control circuit includes
 a fuse circuit that provides activating signals to the sub-word selecting circuits when received address values match an address determined by programming fuse devices within the fuse circuit; and
 the sub-word selecting circuits activate and deactivate redundancy sub-word selecting signals in response to at least one activating signal from the fuse circuit, a first sub-word selecting signal, and a second sub-word selecting signal that is complementary to the first sub-word selecting signal.

4. The semiconductor storage device with a redundancy circuit of claim 3, wherein:
 the first sub-word selecting signal is generated from an address value that is different than the address values received by the fuse circuit; and
 the second sub-word selecting signal is generated by inverting the first sub-word selecting signal with an inverter.

5. The semiconductor storage device with a redundancy circuit of claim 3, wherein:
 each sub-word selecting circuit includes at least one output section that provides a redundancy sub-word selecting signal, each output section including
 at least one p-channel transistor having a source coupled to a boosted power source, a drain coupled to an output terminal, a gate coupled to a p- channel control signal, the p-channel control signal being generated by a logical combination of at least one sub-word selecting signal and an activating signal from the fuse circuit, the p-channel control signal varying between the boosted power source potential and another potential, and
 at least one n-channel transistor having a drain coupled to the drain of the at least one p-channel transistor and a source coupled to a reference power source.

6. A semiconductor storage device with a redundancy circuit, comprising:
 a plurality of sub-banks, each sub-bank including a plurality of input/output (I/O) units having first through mth plates, where m is an integer greater than two, each plate including a plurality of memory cells, main word lines for selecting a plurality of memory cells, sub-word lines that provide a lower level of memory cell selection than main word lines, a row redundancy circuit that includes a plurality of redundancy memory cells, redundancy main word lines, and redundancy sub-word lines;
 a plurality of redundancy main-word drivers for driving the redundancy main-word lines, each redundancy main-word driver including a main plate decoder that receives address values and activates at least one plate of an I/O unit and a redundancy main-word line within the activated plate;
 a redundancy selection control circuit that includes a redundancy plate decoder that receives address values and generates a plate select signal;
 a fuse circuit that receives the plate select signal, a pre-charge signal, and address selecting signals and generates an activating signal when the address selecting signals correspond to an address selecting value determined by programming fuse elements in the fuse circuit; and
 at least one sub-word selecting circuit that receives the activating signal and independently controls the activation and deactivation of redundancy sub-word selecting signals, each sub-word selecting signal controlling the activation and deactivation of a redundancy sub-word line.

7. A memory device, comprising:
 a plurality of memory cells;
 a plurality of main word lines;
 a plurality of sub-word lines coupled to the memory cells;
 a row redundancy circuit including
 a plurality of redundancy memory cells,
 at least one redundancy main word line,
 a plurality of redundancy sub-word lines coupled to the redundancy memory cells, and
 a plurality of redundancy sub-word drivers associated with the redundancy main word line, each redundancy sub-word driver being coupled to at least two redundancy sub-word lines and independently controlling the activation and deactivation of each of its redundancy sub-word lines according to the potential of the associated main word line and a plurality of redundancy sub-word selecting signals; and
 a programmable address detection circuit that includes a plurality of programmable elements that can store a plurality of programmed addresses, the programmable address detection circuit receiving a plurality of address values and generating an address match indication signal when address values match a programmed address.

8. The memory device of claim 7, wherein:

each redundancy sub-word line is activated and deactivated according to the potential of a corresponding redundancy sub-word selecting signal.

9. The memory device of claim 7, wherein:

each redundancy sub-word driver includes controllable impedance paths disposed between its redundancy sub-word lines and an independent activation voltage, the controllable impedance paths being controlled by the redundancy main word line potential, the independent activation voltages being generated by the redundancy sub-word selecting signals.

10. The memory device of claim 7, further including:

a sub-word selecting circuit having
- a boost supply node that can be coupled to a boost supply voltage, and
- a boost controllable impedance path coupled between a redundancy sub-word selecting signal output node and the boost supply node, the redundancy sub-word selecting signal output node providing a redundancy sub-word selecting signal.

11. The memory device of claim 10, wherein:

the boost controllable impedance path includes a p-channel insulated gate field effect transistor having a source-drain path coupled between the redundancy sub-word selecting signal output node and the boost supply node.

12. The memory device of claim 10, wherein:

the sub-word selecting circuit further includes
- a level shift circuit that controls the boost controllable impedance path, the level shift circuit receiving an activation control signal having a first logic high value that is less than a boost supply voltage and providing a boost control signal having a second logic high value that is greater than the first logic high value, and
- the boost controllable impedance path is controlled by the boost control signal.

13. The memory device of claim 10, wherein:

the sub-word selecting circuit further includes
- a reference supply node that can be coupled to a reference voltage,
- a reference controllable impedance path coupled between a redundancy sub-word selecting signal output node and the reference supply node, and
- an edge delay circuit that receives an activation signal and provides a reference control signal that controls the reference controllable impedance path.

14. The memory device of claim 7, wherein:

the programmable elements include fusible links.

15. The memory device of claim 7, wherein:

the programmable address detection circuit includes
- a plurality of nodes,
- at least one precharge device coupled to a corresponding node, each precharge device including a controllable impedance path coupled between a precharge potential and its corresponding node, and
- a plurality of programmable devices coupled to each node.

16. The memory device of claim 7, further including:

the programmable address detection circuit can be activated and deactivated by a plate selection signal; and a plate decoder circuit that decodes a plurality of address values and generates a plate selection signal.

17. The memory device of claim 7, wherein:

the programmable address detection circuit can generate a plurality of match indication signals, each match indication signal activating at least one redundancy sub-word line independently of any other match indication signal.

18. The memory device of claim 7, wherein:

each match indication signal deactivating at least one sub-word line.

19. The memory device of claim 7, wherein:

the memory device is logically arranged into a plurality of input/output (I/O) units selectable according to a first set of address values, each I/O unit including a plurality of plates selectable according to a second set of address values, each I/O unit including
- at least one main word line;
- a plurality of sub-word lines; and
- at least one row redundancy circuit.

20. A semiconductor storage device with a redundancy circuit, comprising:

a redundancy main word line extending in a first direction and having a first point and second point apart from said first point;

a first redundancy sub-word driver disposed adjacently to said first point and remotely from said second point and connected to said first point, for driving first and second redundancy sub-word lines that extend in said first direction, said first redundancy sub-word driver independently controlling the activation and deactivation of said first and second redundancy sub-word lines according to a first redundancy sub-word selecting signal;

a second redundancy sub-word driver disposed adjacently to said second point and remotely from said first point and connected to said second point, for driving redundancy third and fourth sub-word lines that extend in said first direction, said second redundancy sub-word driver independently controlling the activation and deactivation of said third and fourth redundancy sub-word lines according to a second redundancy sub-word selecting signal which is different from said first redundancy sub-word selecting signal; and a redundancy selection control circuit activating one of said first and second redundancy sub-word selecting signals and deactivating the other of said first and second redundancy sub-word selecting signals.

21. The device of claim 20, wherein:

said redundancy selection control circuit includes
- a fuse circuit that provides activating signals to a plurality of sub-word selecting circuits when received address values match an address determined by programming fuse devices within the fuse circuit; and
- said sub-word selecting circuits activate and deactivate redundancy sub-word selecting signals in response to at least one activating signal from said fuse circuit.

22. The device of claim 20, wherein:

said first redundancy sub-word line is arranged to correspond with said third redundancy sub-word line so that when one of said first and third redundancy sub-word lines is activated the other one is deactivated, said second redundancy sub-word line is arranged to correspond with said fourth redundancy sub-word line so that when one of said second and fourth redundancy sub-word line is activated the other one is deactivated.

* * * * *